(12) United States Patent
Tan et al.

(10) Patent No.: US 12,153,069 B2
(45) Date of Patent: Nov. 26, 2024

(54) BATTERY PROBING MODULE

(71) Applicants: Shih-Ching Tan, Taoyuan (TW); Chun-Nan Ou, Taoyuan (TW); Tzu-Fu Chen, Taoyuan (TW); Chen-Chou Wen, Taoyuan (TW); Chiang-Cheng Fan, Taoyuan (TW)

(72) Inventors: Shih-Ching Tan, Taoyuan (TW); Chun-Nan Ou, Taoyuan (TW); Tzu-Fu Chen, Taoyuan (TW); Chen-Chou Wen, Taoyuan (TW); Chiang-Cheng Fan, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 0 days.

(21) Appl. No.: 18/115,784

(22) Filed: Mar. 1, 2023

(65) Prior Publication Data
US 2023/0288449 A1  Sep. 14, 2023

(30) Foreign Application Priority Data

Mar. 11, 2022  (TW) .................................. 111109010

(51) Int. Cl.
*G01R 1/073* (2006.01)
(52) U.S. Cl.
CPC .................................. *G01R 1/073* (2013.01)
(58) Field of Classification Search
None
See application file for complete search history.

(56) References Cited

U.S. PATENT DOCUMENTS

| | | | | |
|---|---|---|---|---|
| 2013/0069629 A1* | 3/2013 | Nagpal | ................. | G01R 19/02 324/103 P |
| 2013/0071705 A1* | 3/2013 | Frutschy | ............. | H01M 50/224 429/62 |

FOREIGN PATENT DOCUMENTS

| | | | |
|---|---|---|---|
| CN | 107089708 | * | 8/2017 |
| CN | 210465639 U | | 5/2020 |
| CN | 113064082 A | | 7/2021 |
| CN | 215812943 U | | 2/2022 |
| JP | 2021141034 A | | 9/2021 |

* cited by examiner

*Primary Examiner* — Farhana A Hoque (57) ABSTRACT

The present invention provides a battery probing module, for testing a battery defined with a contact surface having a first electrode area and a second electrode area with different polarities. The battery probing module comprises a frame and a plurality of probe units. The frame has a top plate and a bottom plate opposite to the top plate. Each of the plurality of probe units comprises a base, a first probe, and a plurality of second probes. The base is defined with a top surface and a bottom surface deflectably fixed to the top surface by a fixing unit. The first probe and the plurality of second probes protrude from the bottom surface for contacting the first electrode area and the second electrode area respectively. Wherein the first probe is within a periphery surrounded by the plurality of second probes in a vertical direction of the bottom surface.

7 Claims, 8 Drawing Sheets

BATTERY PROBING MODULE

CROSS REFERENCE TO RELATED APPLICATION

The present application claims priority to Taiwan patent application Serial No. 111202452 filed on Mar. 11, 2022 the entire content of which is incorporated by reference to this application.

BACKGROUND OF THE INVENTION

1. Field of the Invention

The present invention pertains to a battery probing module, more specifically to a battery probing module capable of slightly deflecting its probe.

2. Description of the Prior Art

Generally speaking, when performing an electrical test on a whole batch of batteries, a plurality of batteries need to be placed on a tray, and an alignment procedure between the tray and the battery probing module is also needed in the first place. And then, the tray is controlled to move toward the battery probing module. However, in order to facilitate quick replacement of the batteries on the tray (or for other practical reasons), these batteries are usually not tightly fixed in the tray. For example, the tray may have multiple battery slots, and each battery is designed to be placed in one of the battery slots, but because the diameter of the battery slot is often larger than the diameter of the battery, the battery is likely to be displaced or slightly shaken in the battery slot. That is to say, each battery may not be accurately placed in the center of the battery slot, and the battery may also be vibrated and leaned against one side of the battery slot during the handling of the tray. Therefore, there may have obvious differences in the gap between the battery and the inside of the battery slot in different directions.

In other words, although the tray and the battery probing module will go through the alignment procedure, each battery in the tray can still move slightly in the battery slot. When multiple probes of the battery probing module are pressed against the electrode of the battery, the electrode of the battery may not be able to effectively contact all the probes. In addition, if the battery has been skewed in the battery slot, the electrodes of the battery may be scratched by the probes due to misalignment, and the probes may also be damaged by the skewed battery while pressing the multiple probes. On the other hand, the multiple probes of different polarities in the traditional battery probing module often contact corresponding electrodes in different directions, for example, the anode probe contacts the positive electrode from top to bottom, and the cathode probe contacts the negative electrode from bottom to top. Person having ordinary skill in the art can understand that when multiple probes push the battery in different directions, the battery may shake or deflect unexpectedly, so that the electrodes of the battery cannot effectively contact all the probes. Accordingly, the industry needs a new battery probing module that can overcome the problem of battery displacement or skewing in the battery slot, so that the electrodes of the battery can be effectively contacted with the probes.

SUMMARY OF THE INVENTION

The present invention provides a battery probing module, which provides a deflectable base, so that the probe arranged in the base can be elastically aligned with the displaced or skewed battery electrodes. In addition, the probes of different polarities in the battery probing module face the same contact surface, which can also avoid unexpected shaking or deflection of the battery due to the push of the probes in different directions on different sides of the battery.

The present invention provides a battery probing module, for testing a battery defined with a contact surface having a first electrode area and a second electrode area with different polarities. The battery probing module comprises a frame and a plurality of probe units. The frame has a top plate and a bottom plate opposite to the top plate. Each of the plurality of probe units comprises a base, a first probe, and a plurality of second probes. The base is defined with a top surface and a bottom surface, the top surface is provided with a fixing unit deflectably fixed to the bottom plate. The first probe, disposed on the base, protrudes from the bottom surface for contacting the first electrode area. The plurality of second probes, disposed on the base, protrude from the bottom surface for contacting the second electrode area. Wherein the first probe is within a periphery surrounded by the plurality of second probes in a vertical direction of the bottom surface.

In some embodiments, wherein the fixing unit comprises a fixing member, a spacer, and a clamping block, the spacer is ring-shaped and arranged in a fixing hole of the bottom plate, the clamping block and the base are respectively located on two sides of the bottom plate, and the fixing member sequentially passes through the clamping block and the spacer in the vertical direction and is fixed to the base. Besides, the clamping block has a first hole, the base has a second hole, the fixing member passes through the first hole in the vertical direction and is fixed in the second hole, the fixing member is a clearance fit with the first hole, and the fixing member is a interference fit with the spacer and the second hole respectively.

In some embodiments, the top plate is provided with a plurality of air ducts, each of the air ducts corresponds to one of the probe units, each of the air ducts blows an airflow toward the corresponding top surface. The base is a hollow structure communicating with the top surface and the bottom surface of the base. each of the air ducts is electrically connected to a temperature adjustment unit. The temperature adjustment unit adjusts an airflow amount or an airflow temperature of the passing airflow according to the temperature of the contact surface, the first probe, or the second probes. The bottom surface is provided with a plurality of guide members, each of the guide members protrudes from the bottom surface and has a conical end portion, and the conical end portion is used for contacting a casing edge of the battery. The height of each of the guiding members protruding from the bottom surface is greater than the height of the first probes and the second probes protruding from the bottom surface. A first end surface of the first probe and a second end surface of each of the second probes face the same direction.

To sum up, the battery probing module provided by the present invention elastically aligns the displaced or skewed electrodes through the deflectable base, thereby improving the contact efficiency between the electrodes of the battery and the probes. In addition, the probes of different polarities of the battery probing module are all facing the same contact surface, which solves the unexpected shaking or deflection caused by the pushing of traditional probes in different directions.

DETAILED DESCRIPTION OF THE INVENTION

The features, targetions, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
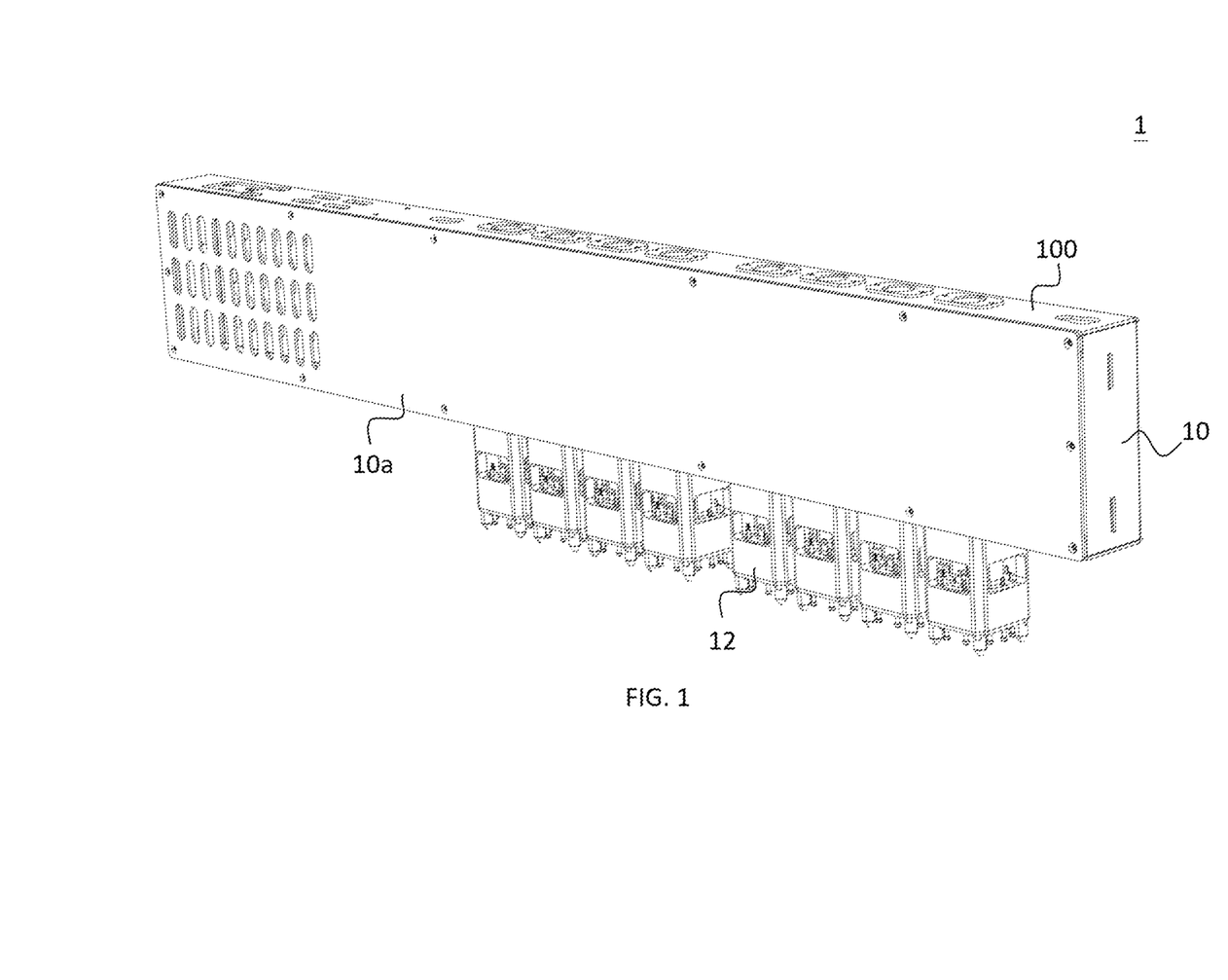
FIG. 1 illustrates a perspective view of a battery probing module according to an embodiment of the present invention.
Figure 2:
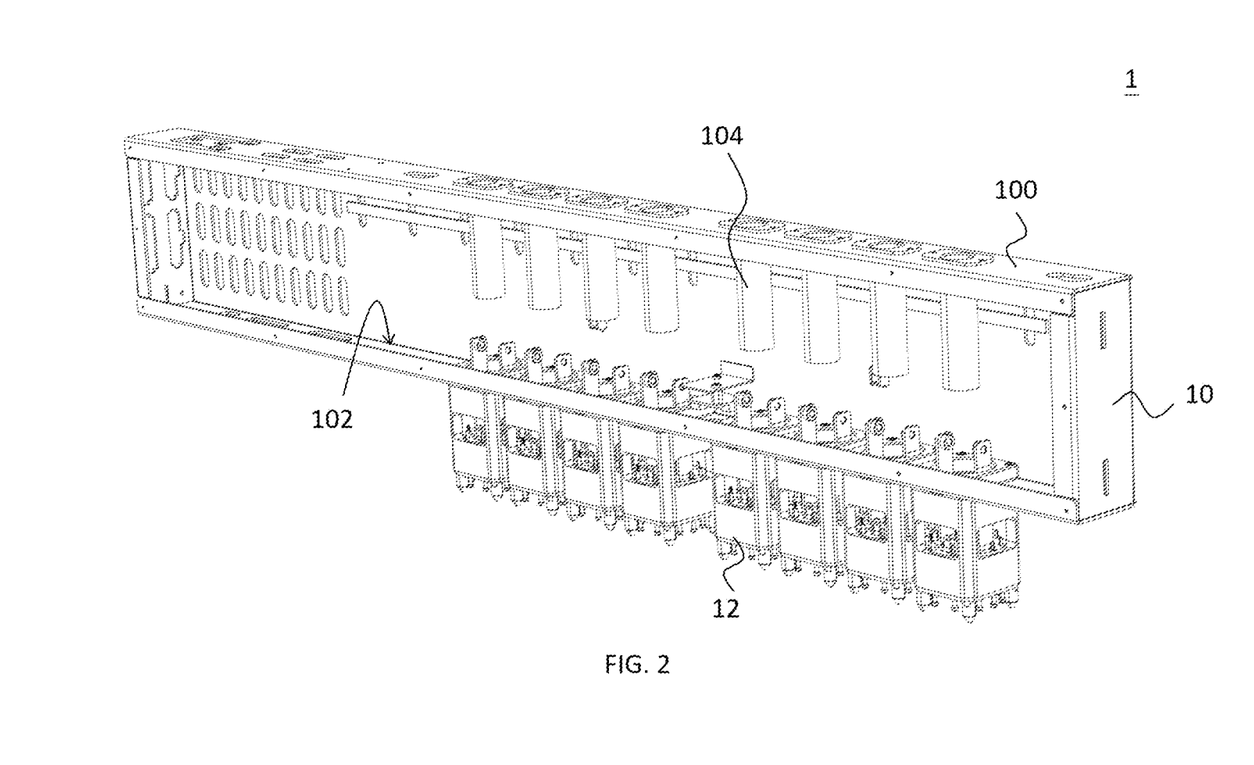
FIG. 2 illustrates a perspective view of a battery probing module with a side cover removed according to an embodiment of the present invention.

Please refer to FIG. 1 and FIG. 2 together. FIG. 1 illustrates a perspective view of a battery probing module according to an embodiment of the present invention, and FIG. 2 illustrates a perspective view of a battery probing module with a side cover removed according to an embodiment of the present invention. As shown in figures, the battery probing module 1 has a frame 10 and a plurality of probe units 12 for testing one or more batteries (not shown). In practice, when batteries are tested in batches, multiple batteries can be placed in the tray in certain pattern (not shown). For example, the tray can be provided with battery slots arranged in an array, and each battery can be placed in one of the battery slots. The battery probing module 1 and the tray can be vertically aligned. After the alignment is completed, the tray can be vertically lifted to approach the battery probing module 1. Of course, this embodiment does not limit the tray or the battery probing module 1 to be lifted vertically, person having ordinary skill in the art can choose to move the tray or the battery probing module 1 according to different testing devices. This embodiment does not limit the appearance and size of the battery. In one example, the battery can be packaged into a cylinder, the top of the cylinder can be defined as a contact surface, and the contact surface can be divided into different polarities (positive and negative polarities), for example a first electrode area and a second electrode area. The first electrode area and the second electrode area may be two concentric circles, and the first electrode area is located inside the second electrode area.

Following the above, a central position of the contact surface may be the first electrode area (corresponding to the positive electrode), and an edge position of the contact surface may be the second electrode area (corresponding to the negative electrode). Person having ordinary skill in the art should understand that there should be an insulating region between the first electrode area and the second electrode area, and the first electrode area, the insulating region, and the second electrode area may be three concentric circles. In one example, the first electrode area, the insulating region, and the second electrode area are placed in sequence from the inside to the outside, and the second electrode area just covers the edge of the contact surface. Assuming that the first electrode area is of positive polarity and the second electrode area is of negative polarity, this embodiment does not limit the equipotential range of negative polarity, and it is possible that the side of the battery (the side of the cylinder) also has the same polarity as the second electrode area (negative polarity). It is worth mentioning that the contact surface (the top of the cylinder) may be uneven, there may be, for example, a height difference between the first electrode area and the second electrode area. As long as the normal lines of the first electrode area and the second electrode area has the same direction, and the first electrode area and the second electrode area still belong to the same contact surface defined in this embodiment.

As can be seen from the figures, the frame 10 may be a hollow box, and has a top plate 100 and a bottom plate 102 on opposite sides. In order to illustrate the structure inside the frame 10, a side cover 10a between the top plate 100 and the bottom plate 102 in FIG. 1 can be removed, and the relative positions of the top plate 100 and the bottom plate 102 can be seen from FIG. 2. In practice, the top plate 100 and the bottom plate 102 are respectively on the upper and lower sides of the frame 10, and both of the top plate 100 and the bottom plate 102 have openings, and there may be space inside the frame 10 for accommodating other components. In one example, a plurality of probe units 12 are disposed on the bottom plate 102, and the top plate 100 may be provided with a plurality of air ducts 104. The plurality of air ducts 104 are connected to an external air conditioner (not shown) to deliver airflows. Although FIG. 2 does not show the rest part of the plurality of air ducts 104 outside the frame 10, person having ordinary skill in the art should understand that each air duct 104 can be connected to an independent air conditioner, or the air ducts 104 may be connected to each other through a larger piping, and then connected to the same air conditioner, which is not limited in this embodiment. In addition, the number of air ducts 104 may correspond to the number of probe units 12, and the position of the air outlet of each air duct 104 may be aligned with the probe units 12 below in the vertical direction.

In one example, an airflow amount or an airflow temperature of an airflow delivered by each air duct 104 can be adjusted. For example, when the plurality of air ducts 104 are connected to the same air conditioner, under the condition that the pipe diameter, length or material of each air duct 104 are substantially the same, the airflow amount and the airflow temperature delivered by each air duct 104 should also be approximately the same. Therefore, in this embodiment, the airflow amount and the airflow temperature can be determined by controlling the external air conditioner. For another example, when each air duct 104 is connected to its respective air conditioner, the airflow amount and the airflow temperature can be determined by the respective air conditioner.

It is worth mentioning that even if multiple air ducts 104 are connected to the same air conditioner, the airflow amount and the air temperature delivered by each air duct 104 may also be different. In one example, a fan (not shown) may be provided inside each air duct 104, and the fan may be controlled by a temperature adjustment unit (not shown). When the temperature adjustment unit determines that the temperature of the probe unit 12 corresponding to the air duct 104 needs to be lowered, the power/output rate of the fan can be controlled to increase the airflow amount passing through the air duct 104. When the temperature adjustment unit determines that the temperature of the corresponding probe unit 12 needs to be raised, the power/output rate of the fan can be controlled to reduce the airflow amount passing through the air duct 104. It can be seen from the above examples that individualized temperature control can be realized for each probe unit 12. In addition, the piping of the air duct 104 in the frame 10 can be longer than that shown in FIG. 2. For example, the air duct 104 can further be extended toward the probe unit 12. Not only can the airflow interference between the adjacent air ducts 104 be avoided, but also provide a better temperature control efficiency to the probe unit 12.

Figure 3:
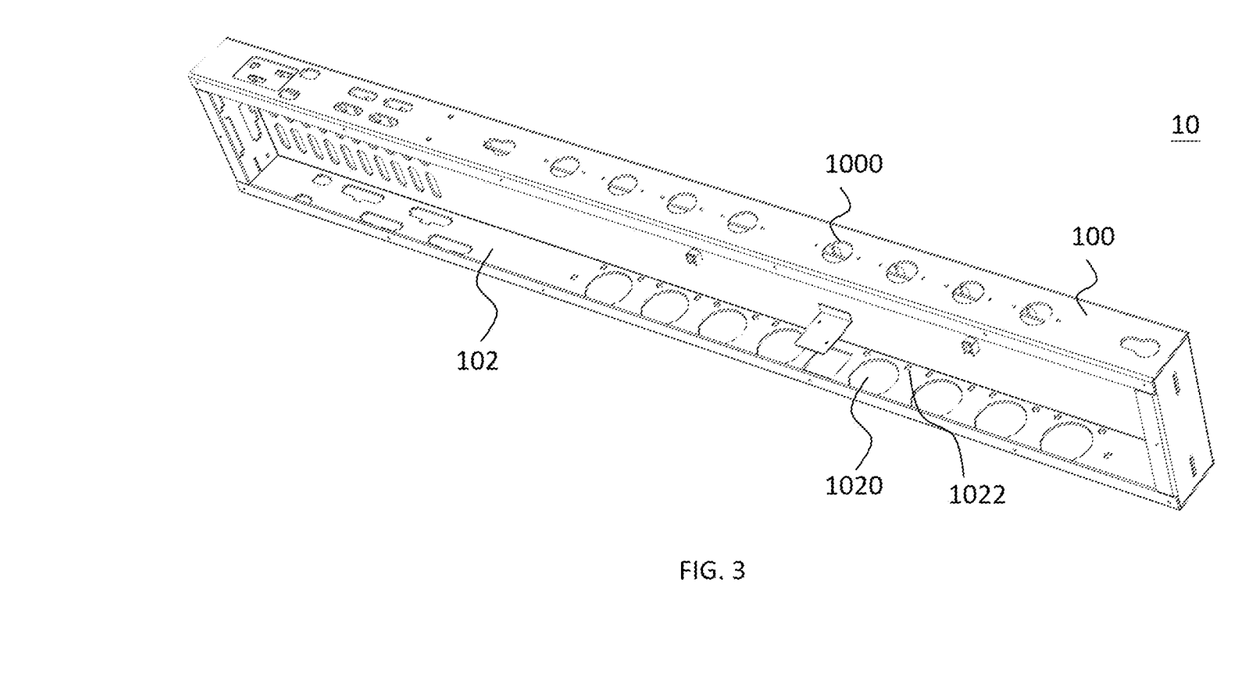
FIG. 3 illustrates a perspective view of a frame according to an embodiment of the present invention.
Figure 4:
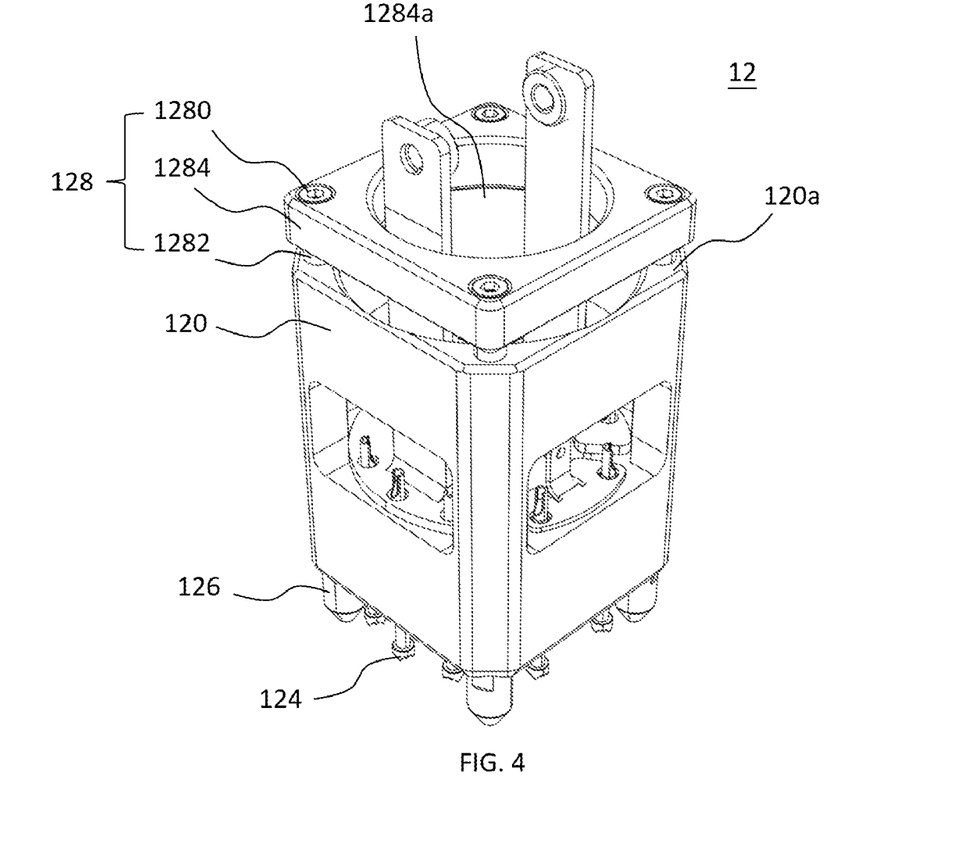
FIG. 4 illustrates a perspective view of a probe unit according to an embodiment of the present invention.
Figure 5:
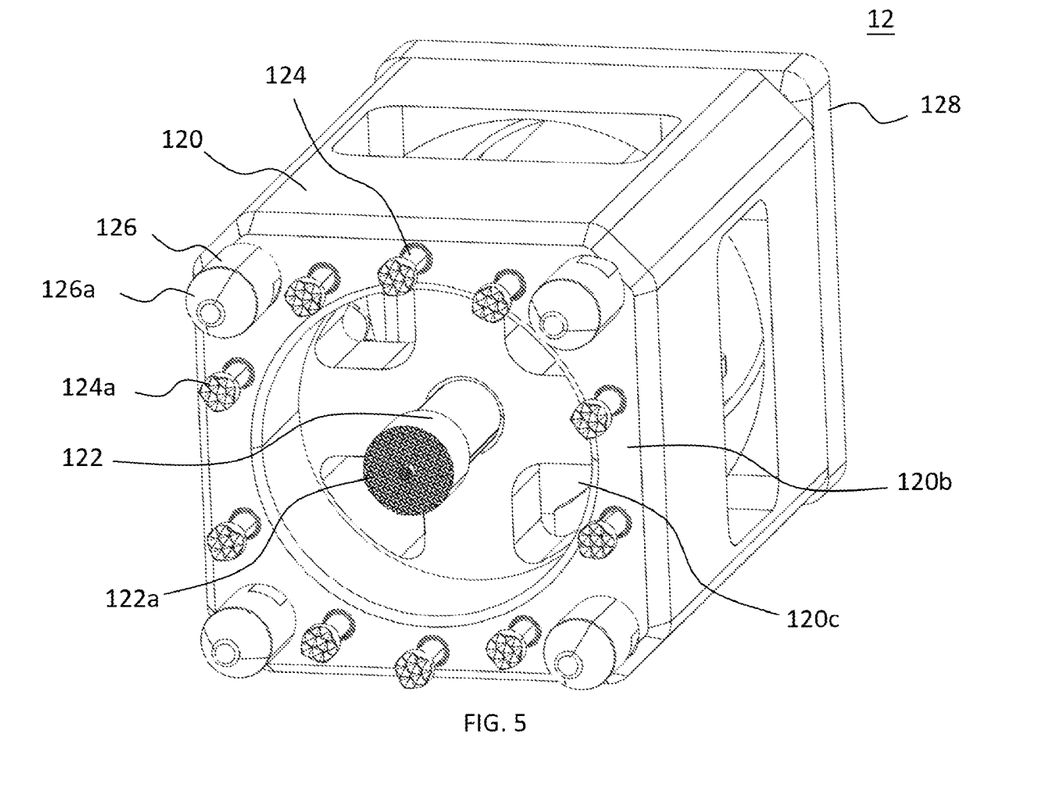
FIG. 5 illustrates another perspective view of the probe unit according to an embodiment of the present invention.
Figure 6:
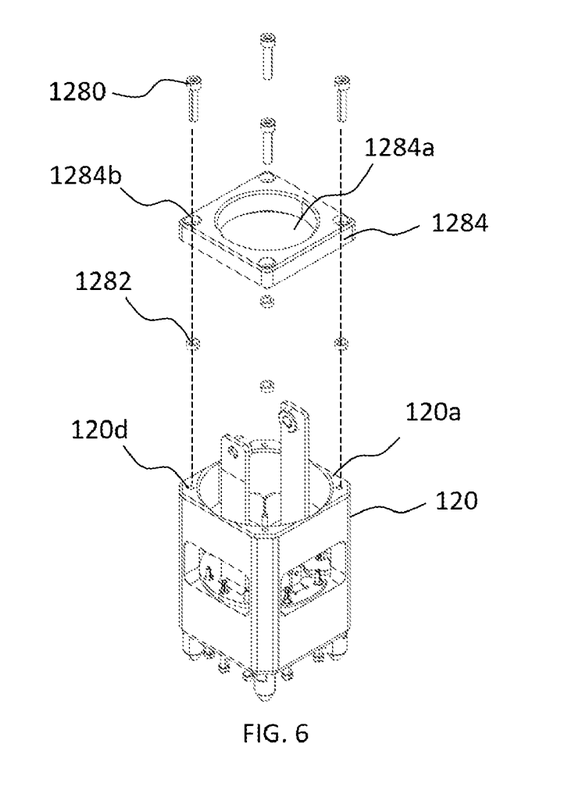
FIG. 6 illustrates an exploded view of the probe unit according to an embodiment of the present invention.

The frame 10 and the probe unit 12 in FIG. 2 are disassembled respectively in this embodiment for further illustration. Please refer to FIG. 2 to FIG. 6 together, FIG. 3 illustrates a perspective view of a frame according to an embodiment of the present invention. FIG. 4 illustrates a perspective view of a probe unit according to an embodiment of the present invention. FIG. 5 illustrates another perspective view of the probe unit according to an embodiment of the present invention. FIG. 6 illustrates an exploded view of the probe unit according to an embodiment of the present invention. As shown in the figures, a plurality of holes 1000 may be provided in the top plate 100 of the frame 10, and each air duct 104 may pass through the corresponded hole 1000 and extend to the inner space of the frame 10. For example, the air duct 104 may extend toward the bottom plate 102 inside the inner space of the frame 10. The bottom plate 102 of the frame 10 may also be provided with a plurality of holes 1020 and a plurality of fixing holes 1022, one of the holes 1020 and several fixing holes 1022 arranged around the hole 1020 may correspond to the same probe unit 12. For example, the central axis of the hole 1020 can exactly overlap the central axis of the base 120 of the probe unit 12. In practice, the hole 1020 can be used to pass the airflow output by the air duct 104, so that the airflow blown out by the air duct 104 can direct to the base 120, and the hole 1020 may also accommodate wires used to connect the corresponding probe unit 12. In addition, the fixing holes 1022 arranged around the hole 1020 can be used to fix the base 120 of the probe unit 12.

The plurality of probe units 12 demonstrated in this embodiment may be the same, and one of the probe units 12 is illustrated for demonstration below. It can be seen from the figures that the probe unit 12 has a base 120, a first probe 122, and a plurality of second probes 124. The base 120 defines a top surface 120a and a bottom surface 120b. The first probe 122 and the plurality of second probes 124 are disposed on the base 120 and protrude from the bottom surface 120b. In practice, the base 120 is a hollow structure, for example, composed of one or more hollow holes 120c. In this way, the hollow structure communicates the top surface 120a and the bottom surface 120b of the base 120, so that the airflow blown out by the air duct 104 can easily pass through the entire base 120. In one example, the airflow blown out by the air duct 104 can directly pass over the entire first probe 122 and each second probe 124, and the airflow may further reach the contact surface of the battery easily. In addition, the hollow structure of the base 120 can also hollow out the sides other than the top surface 120a and the bottom surface 120b of the base 120, so that the weight of the base 120 can be reduced and the heat dissipation effect of the first probe 122 and the plurality of second probes 124 can be improved.

In the aforementioned example, a fan (not shown) may be provided inside each air duct 104, and the fan may be controlled by a temperature adjustment unit (not shown). Here, a temperature sensing line can be placed near the contact surface of the battery (for example, stick it to the first probe 122 or one of the second probes 124) and pass the heat to the temperature adjustment unit for determining whether the contact surface of the battery needs to be heated or cooled. The method of heating or cooling the contact surface of the battery is exemplified in the foregoing embodiments, and will not be repeated in this embodiment.

In addition, the first probe 122 and the plurality of second probes 124 are used to test the battery. For example, the first probe 122 and the plurality of second probes 124 can supply power to the battery during electrical testing, or can be used to detect voltage or current of the battery. Moreover, the plurality of second probes 124 are separately arranged around the first probe 122, and the first probe 122 is within a periphery surrounded by the plurality of second probes 124 in a vertical direction, which is perpendicular to the bottom surface 120b (for example, a normal direction of the bottom surface 120b), of the bottom surface. Taking this embodiment as an example, the aligned tray will move the battery to be tested to the bottom of the probe unit 12, so that the contact surface of the battery is adjacent to the first probe 122 and the plurality of second probes 124. When the tray lifts up with the battery, the first probe 122 will gradually contact and press against the first electrode area (not shown in the figure), and the plurality of second probes 124 will gradually contact and press against the second electrode area (not shown). The advantage is that since the first probe 122 and the plurality of second probes 124 are in the same direction, especially the first end surface 122a of the first probe 122 and the second end surface 124a of the second probe 124 are facing the same direction, toward battery contact surface. That is to say, the probes of different polarities (the first probe 122 and the plurality of second probes 124) in this embodiment all extend downward to contact the center (the first electrode area) and the edge (the second electrode area) of the contact surface respectively.

In one example, the base 120 can also have a plurality of guide members 126, the plurality of guide members 126 are arranged on the bottom surface 120b. The first probe 122, the plurality of second probes 124, and the plurality of guide members 126 are extended in the same direction. In practice, compared with the first probes 122 and the plurality of second probes 124, the plurality of guide members 126 protrude further from the bottom surface 120b, in order to ensure that the plurality of guide members 126 can contact the corresponding battery in the first place and constrain the position of the battery when the tray lifts up, so that the first probe 122 can be properly aligned with the first electrode area, and the plurality of second probes 124 can be properly aligned with the second electrode area. Although the present embodiment depicts the guide members 126 located at the four corners of the bottom surface 120b of the base 120, the present embodiment does not limit the number or shape of the guide member 126, as long as the guide member 126 can guide the battery and constrain the position of the battery. For example, there may be only three guide members arranged in a triangle. Alternatively, the shape of the guide member can be changed into a ring and surrounds the first probe 122 and the plurality of second probes 124, as long as the end of the guide member still has an annular slope facing the center of the bottom surface 120*b*, the purpose of constraining the position of the battery should be able to be achieved.

Each guide member 126 may have a conical end portion 126*a*. Since the end portion 126*a* has a circular arc surface, after contacting the battery, the guide member 126 can push the battery to adjust the position of the battery in the battery slot as the battery lifts upward even if the battery is initially slightly shifted in the position of the battery slot of the tray. In addition, the end portion 126*a* generally contacts the casing edge of the battery and moves the battery by pushing against the casing edge of the battery. For example, assuming that the battery is a cylinder, the uppermost plane of the cylinder may be the contact surface referred to in this embodiment, and the junction between the curved side and the contact surface of the cylinder may be the casing edge. Person having ordinary skill in the art can understand that although the diameter of the battery slot and the diameter of the battery are different, the battery may be able to shake slightly, but it should also not be shifted too far from its preset position when the battery is placed in the battery slot. Therefore, when the tray lifts up with the battery, the end portion 126*a* of each guide member 126 should touch the casing edge without directly poking into the contact surface.

Different from traditional probes with different polarities that push the battery in different directions, the probes in this embodiment are all in contact with the same contact surface of the battery, which not only avoids the different stress directions and less likely to produce unexpected shaking or deflection. Further, because the contact surface of the battery is below the first probe 122 and a plurality of second probes 124, the battery can be pushed to the tray and placed stably. Therefore, since the first probe 122 and the plurality of second probes 124 have the same direction, this embodiment can improve the contact stability between the electrodes of the battery and the first probe 122 and the plurality of second probes 124, keep the first probe 122 and the plurality of second probes 124 completely touch the electrodes.

Person having ordinary skill in the art can understand that when the first probe 122 is correctly contacted (contacted snugly) to the first electrode area, the contact area between the first probe 122 and the first electrode area is larger, that is, the impedance between the first probe 122 and the first electrode area is reduced. In the same way, the more second probes 124 can be correctly contacted to the second electrode area, the larger the total contact area between the plurality of second probes 124 and the second electrode area is, that is, the impedance between the plurality of second probes 124 and the second electrode area is reduced. When the impedance between the probe provided in this embodiment and the battery electrode is reduced, the heat generated at the contact surface can be reduced, not only the probe can detect the electrical parameters of the battery more accurately, but also the temperature of the battery can be effectively controlled.

Please continue to refer to the figures, the top surface 120*a* of the base 120 is provided with a fixing unit 128, and the fixing unit 128 may have a fixing member 1280, a spacer 1282, and a clamping block 1284. It can be seen from the figures that the probe unit 12 and the fixing unit 128 may be in a one-to-one relationship, that is, the probe unit 12 is deflectably fixed on the bottom plate 102 by the corresponding fixing unit 128. The present embodiment does not limit the number of fixing members 1280, the spacers 1282, and the clamping blocks 1284. The number of the fixing members 1280 and the spacers 1282 can be associated with the number of the fixing holes 1022 arranged around the hole 1020 (corresponding to the same probe unit). It can be seen from the figures that the clamping block 1284 is located in the inner space of the frame 10, and the base 120 is outside the inner space of the frame 10, that is, the base 120 and the clamping block 1284 are respectively on two sides of the bottom plate 102. In one example, the center of the clamping block 1284 may have a hole 1284*a* and a plurality of first holes 1284*b* arranged around the hole 1284*a*. Here, the arrangement of the hole 1284*a* and the first hole 1284*b* may be the same as the arrangement of the hole 1020 and the fixing holes 1022.

In other words, although the clamping block 1284 is above the bottom plate 102, the airflow blown out by the air duct 104 can still pass through the clamping block 1284 and the bottom plate 102 through the corresponding holes 1020 and holes 1284*a*. In one example, the first probe 122 and the plurality of second probes 124 are electrically connected to an external testing device (not shown) through wires. Wires used for the first probe 122 and the plurality of second probes 124 may also pass through the clamping block 1284 and the bottom plate 102 and be accommodated in the inner space of the frame 10. In addition, the fixing member 1280 can be a screw or a nail, while the clamping block 1284 has a first hole 1284*b*, and the base 120 has a second hole 120*d*. When each fixing member 1280 passes through the first hole 1284*b* of the clamping block 1284, the fixing hole 1022 of the bottom plate 102, and the second hole 120*d* of the base 120 in sequence, no matter whether the fixing member 1280 has been fixed, the base 120 and the bottom plate 102 should also have no obvious misalignment or displacement.

Figure 7:
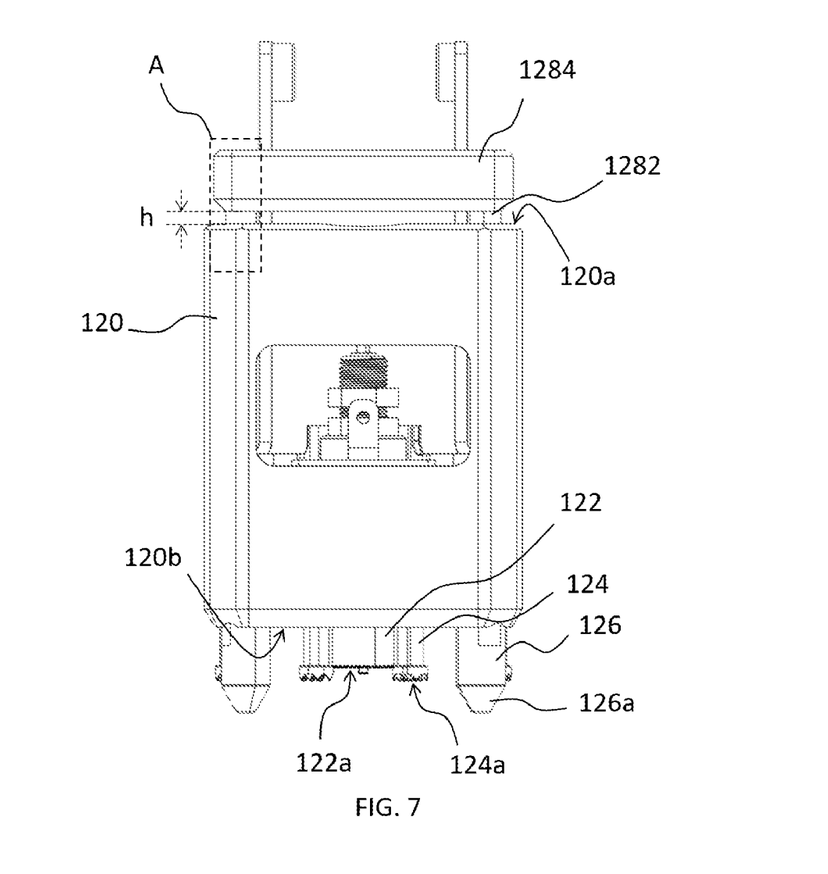
FIG. 7 illustrates a side view of the probe unit according to an embodiment of the present invention.
Figure 8:
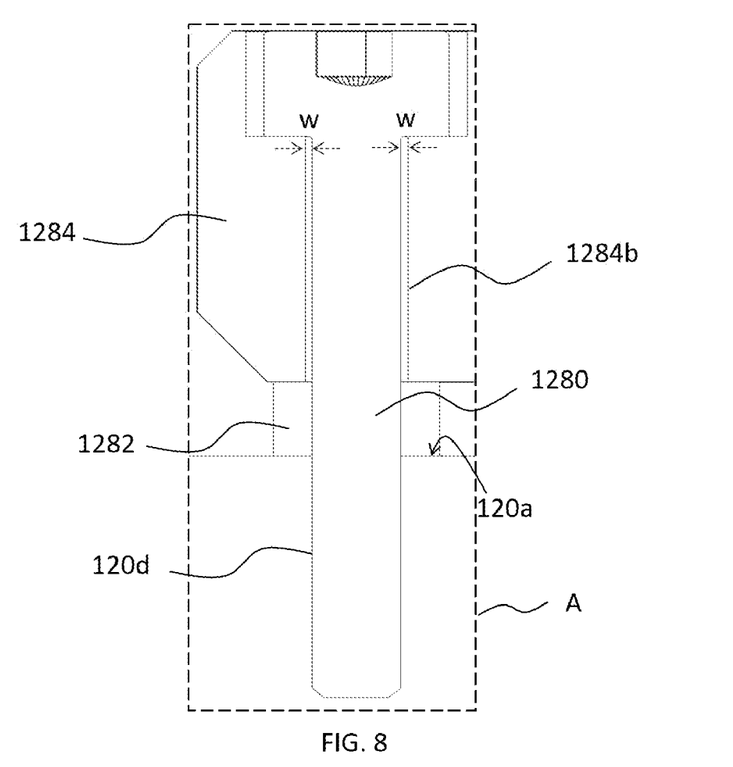
FIG. 8 illustrates a partially enlarged view of a probe unit according to an embodiment of the present invention.

In order to illustrate how the base 120 is deflectably fixed on the bottom plate 102 by the fixing unit 128, please refer to FIGS. 2 to 8 together. FIG. 7 illustrates a side view of the probe unit according to an embodiment of the present invention. FIG. 8 illustrates a partially enlarged view of a probe unit according to an embodiment of the present invention. In this embodiment, the region A around one of the fixing members 1280 is selected as an example in FIG. 7. It can be seen that there is a gap h between the clamping block 1284 and the top surface 120*a* of the base 120. Since the bottom plate 102 is not shown in FIG. 7, the gap h is the thickness of the bottom plate 102. That is to say, the example shown in FIG. 7 simulates that the clamping block 1284 and the base 120 clamp the bottom plate 102 without showing the bottom plate 102. In practice, the diameter of the first hole 1284*b* of the clamping block 1284 will be larger than the diameter of the fixing member 1280, and the fixing member 1280 will be slightly loose in the first hole 1284*b*. As shown in FIG. 8, there will be twice the gap w between the first hole 1284*b* and the fixing member 1280. Based on the above, person having ordinary skill in the art will know that there is a clearance fit between the fixing member 1280 and the first hole 1284*b*.

In addition, the diameter of the fixing hole 1022 of the bottom plate 102 will also be larger than the diameter of the fixing member 1280. In order to allow the fixing member 1280 and the fixing hole 1022 to be more tightly connected, the fixing hole 1022 can be provided with an annular spacer 1282, so that the spacer 1282 will be placed on the outside of the fixing member 1280 when the fixing member 1280 passes through the fixing hole 1022. The spacer 1282 will be against the fixing hole 1022, so that the fixing member 1280, the spacer 1282, and the fixing hole 1022 will not move relative to each other. In practice, the diameter of the central opening of the annular spacer 1282 is slightly smaller than the diameter of the fixing member 1280, so that the spacer 1282 can fit tightly outside the fixing member 1280. In addition, the diameter of the second hole 120*d* of the base 120 is also slightly smaller than the diameter of the fixing member 1280, so that one end of the fixing member 1280 can fix better after being inserted into the second hole 120*d*. Based on the above, person having ordinary skill in the art will know that there are interference fit between the fixing member 1280 and the spacer 1282, and between the fixing member 1280 and the second hole 120*d*.

It can be seen from FIG. 8 that only one end of the fixing member 1280 is fixed in the second hole 120*d*, while the other end of the fixing member 1280 is not fixed in the clamping block 1284. That is to say, the other end of the fixing member 1280 can shake slightly, and the range that can shake up to twice the gap w. However, the fact that the fixing member 1280 can shake does not mean that the fixing member 1280 is not locked. In fact, the fixing member 1280 has indeed been locked in the second hole 120*d*, but because the base 120, the spacer 1282, or the fixing member 1280 are not highly rigid (stiffness) material, the base 120, the spacer 1282 or the fixing member 1280 should be slightly elastic and can withstand slight extrusion, so that the other end of the fixing member 1280 can tilt or vibrate within twice the gap w. In this embodiment, the length of the fixing member 1280 is not limited here, nor is the length of the fixing member 1280 fixed in the second hole 120*d*. Person having ordinary skill in the art can understand that, in order to allow the other end of the fixing member 1280 to tilt or vibrate within twice the gap w, the length of the fixing member 1280 fixed in the second hole 120*d* can be less than half or third of the total length of the fixing member 1280.

As a practical example, assuming that the initial position of the battery in the battery slot of the tray is slightly shifted (for example, tilted), in addition to trying to guide the battery to move by a plurality of guide members 126, the first probe 122 and the plurality of second probes 124 may also deflect, so that the first probe 122 and the plurality of second probes 124 can vertically contact the contact surface of the battery. In one example, when the battery begins to rise toward the corresponding base 120, the plurality of guide members 126, the first probes 122, or the plurality of second probes 124 will gradually begin to bear stress after contacting the battery. In particular, when the contact surface of the battery is tilted due to misplacement, whether it is the casing edge where the plurality of guide members 126 contact, or the electrode area where the first probe 122 and the plurality of second probes 124 contact, except for bearing the stress in the vertical direction, it will also bear the lateral stress. However, since this embodiment demonstrates an example in which the fixing member 1280 can be deflected, when the plurality of guide members 126, the first probes 122, or the plurality of second probes 124 are subjected to lateral stress, they will drive the base 120 together to take the lateral stress. At this time, the fixing member 1280 that has been locked in the second hole 120*d* will also be subject to the lateral stress because it is already connected to the base 120. However, since the other end of the fixing member 1280 can shake slightly, the fixing member 1280 of this embodiment can drive the base 120 to shift adaptively horizontally or angularly, so that the lateral stress can be released. In this way, the first probe 122 and the plurality of second probes 124 in this embodiment have the opportunity to adjust the angle of its end surface, so that the first probe 122 and the plurality of second probes 124 can return to the situation of being perpendicular to the contact surface that further increases the contact area between the first probe 122 and the plurality of second probes 124 and their respective electrode areas.

To sum up, the battery probing module provided by the present invention elastically aligns the displaced or skewed electrodes through the deflectable base, thereby improving the contact efficiency between the electrodes of the battery and the probes. In addition, the probes of different polarities of the battery probing module are all facing the same contact surface, which solves the unexpected shaking or deflection caused by the pushing of traditional probes in different directions.

What is claimed is:

1. A battery probing module, for testing a battery defined with a contact surface having a first electrode area and a second electrode area with different polarities, comprising:
   a frame having a top plate and a bottom plate opposite to the top plate; and
   a plurality of probe units, and each probe unit comprising:
      a base defined with a top surface, provided with a fixing unit deflectably fixed to the bottom plate, and a bottom surface;
      a first probe, disposed on the base, protruding from the bottom surface for contacting the first electrode area; and
      a plurality of second probes, disposed on the base, protruding from the bottom surface for contacting the second electrode area;
   wherein the first probe is within a periphery surrounded by the plurality of second probes in a vertical direction of the bottom surface,
   wherein the fixing unit comprises a fixing member, a spacer, and a clamping block, the spacer is ring-shaped and arranged in a fixing hole of the bottom plate, the clamping block and the base are respectively located on two sides of the bottom plate, and the fixing member passes through the clamping block and the spacer sequentially in the vertical direction and is fixed to the base.

2. The battery probing module according to claim 1, wherein the clamping block has a first hole, the base has a second hole, the fixing member passes through the first hole in the vertical direction and is fixed in the second hole, the fixing member is a clearance fit with the first hole, and the fixing member is an interference fit with the spacer and the second hole respectively.

3. The battery probing module according to claim 1, wherein the top plate is provided with a plurality of air ducts, each of the air ducts corresponds to one of the probe units, each of the air ducts blows an airflow toward the corresponding top surface, the base is a hollow structure communicating with the top surface and the bottom surface of the base.

4. The battery probing module according to claim 3, wherein each of the air ducts is electrically connected to a temperature adjustment unit for adjusting an airflow amount or an airflow temperature of the passing airflow according to the temperature of the contact surface, the first probe, or the second probes.

5. The battery probing module according to claim 1, wherein the bottom surface is provided with a plurality of guide members, each of the guide members protrudes from the bottom surface and has a conical end portion, and the conical end portion is used for contacting a casing edge of the battery.

6. The battery probing module according to claim 1, wherein the height of each of the guiding members protruding from the bottom surface is greater than the height of the first probes and the second probes protruding from the bottom surface.

7. The battery probing module according to claim 1, wherein a first end surface of the first probe and a second end surface of each of the second probes face the same direction.

* * * * *